(12) United States Patent
Miyanaga et al.

(10) Patent No.: US 8,361,226 B2
(45) Date of Patent: Jan. 29, 2013

(54) III-NITRIDE SINGLE-CRYSTAL GROWTH METHOD

(75) Inventors: Michimasa Miyanaga, Itami (JP); Naho Mizuhara, Itami (JP); Shinsuke Fujiwara, Itami (JP); Hideaki Nakahata, Itami (JP); Tomohiro Kawase, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 1116 days.

(21) Appl. No.: 12/067,936

(22) PCT Filed: Mar. 22, 2007

(86) PCT No.: PCT/JP2007/055868
§ 371 (c)(1),
(2), (4) Date: Mar. 25, 2008

(87) PCT Pub. No.: WO2007/111219
PCT Pub. Date: Oct. 4, 2007

(65) Prior Publication Data
US 2010/0147211 A1 Jun. 17, 2010

(30) Foreign Application Priority Data
Mar. 29, 2006 (JP) .................. 2006-091389

(51) Int. Cl.
*C30B 21/02* (2006.01)
(52) U.S. Cl. ............. 117/86; 117/84; 117/107; 117/109
(58) Field of Classification Search .................... 117/86, 117/84, 107, 109
See application file for complete search history.

(56) References Cited

U.S. PATENT DOCUMENTS

| 5,858,086 A | 1/1999 | Hunter |
| 5,972,109 A * | 10/1999 | Hunter ........................ 117/204 |
| 6,001,748 A * | 12/1999 | Tanaka et al. ................ 438/791 |
| 6,296,956 B1 | 10/2001 | Hunter |

FOREIGN PATENT DOCUMENTS

| DE | 3035992 A1 | 5/1982 |
| JP | 2004-307333 A | 11/2004 |
| JP | 2005-343722 A | 12/2005 |
| JP | 2006-027988 A | 2/2006 |
| JP | 2006-052123 A | 2/2006 |
| WO | WO-00-22204 A | 4/2000 |
| WO | WO-2006-110512 A1 | 10/2006 |

OTHER PUBLICATIONS

J.H. Edgar et al., "Bulk AlN Crystal Growth: Self-Seeding and Seeding on 6H-SiC Substrates," Journal of Crystal Growth, Dec. 1, 2002, pp. 187-193, vol. 246, Elsevier, Amsterdam, NL.
R. Schlesser et al., "Crucible Materials for Growth of Aluminum Nitride Crystals," Journal of Crystal Growth, Jul. 15, 2005, pp. 75-80, vol. 281, Elsevier, Amsterdam, NL.

* cited by examiner

*Primary Examiner* — Bob M Kunemund
(74) *Attorney, Agent, or Firm* — James W. Judge

(57) ABSTRACT

This III-nitride single-crystal growth method, being a method of growing a $Al_xGa_{1-x}N$ single crystal (4) by sublimation, is furnished with a step of placing source material (1) in a crucible (12), and a step of sublimating the source material (1) to grow $Al_xGa_{1-x}N$ ($0<x\leq1$) single crystal (4) in the crucible (12), with the $Al_yGa_{1-y}N$ ($0<y\leq1$) source (2) and an impurity element (3), which is at least one selected from the group consisting of IVb elements and IIa elements, being included in the source material (1). This growth method makes it possible to stably grow bulk III-nitride single crystals of low dislocation density and of favorable crystallinity.

10 Claims, 4 Drawing Sheets

III-NITRIDE SINGLE-CRYSTAL GROWTH METHOD

TECHNICAL FIELD

The present invention relates to methods of growing Group III nitride single crystals utilized in substrates for light-emitting diodes, electronic devices, semiconductor sensors, and other semiconductor devices. In particular the invention relates to a method of growing low-dislocation-density III-nitride single crystals of favorable crystallinity.

BACKGROUND ART

III-nitride crystals such as $Al_xGa_{1-x}N$ ($0<x\leq1$, likewise hereinafter) single crystals are extraordinarily useful as materials for building semiconductor devices such as light-emitting diodes, electronic devices, and semiconductor sensors.

Examples that have been proposed of how to manufacture such III-nitride single crystals include vapor-phase techniques, particularly among which sublimation has been singled out from the perspective of obtaining crystals of satisfactory crystallinity with a narrow full-width at half-maximum for the X-ray diffraction peak. (Cf., for example, the specifications for U.S. Pat. No. 5,858,086 (Patent Document 1), U.S. Pat. No. 6,296,956 (Patent Document 2), and U.S. Pat. No. 6,001,748 (Patent Document 3).)

However, with attempts to manufacture by sublimation a bulk III-nitride single crystal—for example (repeated similarly hereinafter), 2 inches (approximately 5.08 cm) in diameter×2 mm or more in thickness—leading, due principally to the fact that no high-quality crystals ideal for undersubstrates exist, to problems of crystal growth being nonuniform and of increased dislocation density, crystallinity degradation, and incidents of polycrystallization, methods of stably growing $Al_xGa_{1-x}N$ single crystal of practicable size, and of low dislocation density and favorable crystallinity have yet to be proposed.

Patent Document 1: U.S. Pat. No. 5,858,086 specification
Patent Document 2: U.S. Pat. No. 6,296,956 specification
Patent Document 3: U.S. Pat. No. 6,001,748 specification

DISCLOSURE OF INVENTION

Problem Invention is to Solve

An object of the present invention is to make available a method of stably growing bulk III-nitride single crystal of low dislocation density and favorable crystallinity.

Means for Resolving the Problem

The present invention is a III-nitride single-crystal growth method furnished with a step of placing source material in a crucible, and a step of sublimating the source material to grow an $Al_xGa_{1-x}N$ ($0<x\leq1$) single crystal in the crucible, wherein the source material includes an $Al_yGa_{1-y}N$ ($0<y\leq1$) source and an impurity element, which is at least one selected from the group consisting of Group IVb elements and Group IIa elements.

In a III-nitride single-crystal growth method involving the present invention, a first source material compartment, a second source material compartment, and a crystal-growth compartment are provided in the crucible, with openings for ventilation being provided between the first and the second source material compartments and between at least one of them and the crystal-growth compartment, and the $Al_yGa_{1-y}N$ source material can be arranged in the first source material compartment, and the impurity element in the second source material compartment.

Furthermore, in a III-nitride single crystal growth method involving the present invention, the source material may be a mixture of the $Al_yGa_{1-y}N$ source and the impurity element. Moreover, as the impurity element, any one of Si, C, and Ge can be utilized. Additionally, in the source material, a ratio $n_E/n_A$ of the number of moles $n_E$ of the impurity element atoms to the number of moles $n_A$ of the Al atoms in the $Al_yGa_{1-y}N$ source can be made 0.01 to 0.5 inclusive. Meanwhile, a ratio $n_E/n_O$ of the number of moles $n_E$ of the impurity element atoms to the number of moles $n_O$ of atoms of the oxygen contained in the source material can be made 2 to $1\times10^4$ inclusive. In addition, the crucible can be formed from metal carbide. Furthermore, an undersubstrate can be arranged in the crucible to grow $Al_xGa_{1-x}N$ single crystal on the undersubstrate. The $Al_xGa_{1-x}N$ single crystal diameter can be brought to a span of more than 2 inches. The III-nitride single crystal growth method can be further furnished with a step of sublimating an $Al_tGa_{1-t}N$ ($0<t\leq1$) source to grow onto the $Al_xGa_{1-x}N$ single crystal monocrystalline $Al_sGa_{1-s}N$ ($0<s\leq1$) with a lower impurity-element concentration by comparison to that of the $Al_xGa_{1-x}N$ single crystal.

Effects of the Invention

The present invention affords a method of stably growing bulk III-nitride single crystals of low dislocation density and of favorable crystallinity.

LEGEND

Figure 1:
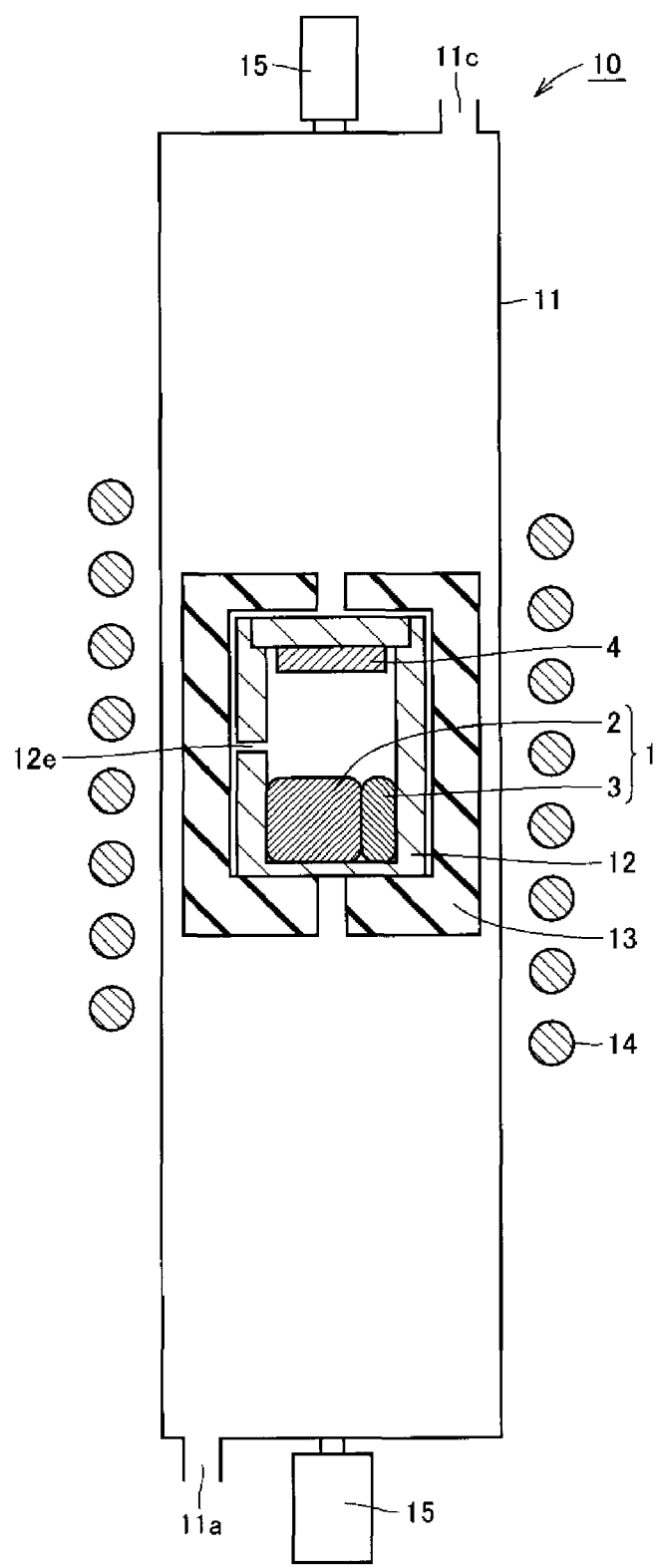
FIG. 1 is a cross-sectional schematic diagram for illustrating one mode of embodying a III-nitride single-crystal growth method involving the present invention.

1: source material; 2: $Al_yGa_{1-y}N$ source; 3: impurity element; 4: $Al_xGa_{1-x}N$ single crystal; 5: $Al_sGa_{1-s}N$ single crystal; 7: $Al_tGa_{1-t}N$ source; 9: undersubstrate; 10: sublimation furnace; 11: reaction chamber; 11a: $N_2$ gas inlet; 11b: $N_2$ gas outlet; 12: crucible; 12a, 12b, 12c, and 12e: ventilation openings; 12p: first source material compartment; 12q: second source material compartment; 12r: crystal-growth compartment; 13: heater; 14: high-frequency heating coils; 15: radiation thermometers; 16: undersubstrate protector.

BEST MODE FOR CARRYING OUT THE INVENTION

Embodiment Mode 1

One embodiment mode of the III-nitride single crystal growth method involving the present invention is characterized in being furnished with a step of, referring to FIG. 1, placing source material 1 in a crucible 12, and a step of sublimating the source material 1 to grow an $Al_xGa_{1-x}N$ ($0<x\leqq1$, likewise hereinafter) single crystal 4 in the crucible 12, and characterized in that the source material 1 is composed of $Al_yGa_{1-y}N$ ($0<y\leqq1$, likewise hereinafter) source 2 and impurity element 3, and the impurity element is at least a single kind element selected from the group consisting of IVb elements and IIa elements.

By including, for the sublimation source material 1, the $Al_yGa_{1-y}N$ source 2 that is a direct source material for forming the $Al_xGa_{1-x}N$ single crystal 4, together with at least a single kind of impurity element 3 selected from the group consisting of IVb elements and IIa elements, the rate at which the $Al_xGa_{1-x}N$ single crystal 4 grows heightens, to grow bulk $Al_xGa_{1-x}N$ single crystal 4 of low dislocation density and favorable crystallinity stably. Such an impurity element E is believed to react with Al to become $Al_pE_q(g)$ (herein, p and q are positive numbers), and to act as material for transporting Al during growth of the $Al_xGa_{1-x}N$ single crystal 4, heightening the crystal growth rate, as well as reducing dislocation densities to enhance crystallinity.

Figure 2:
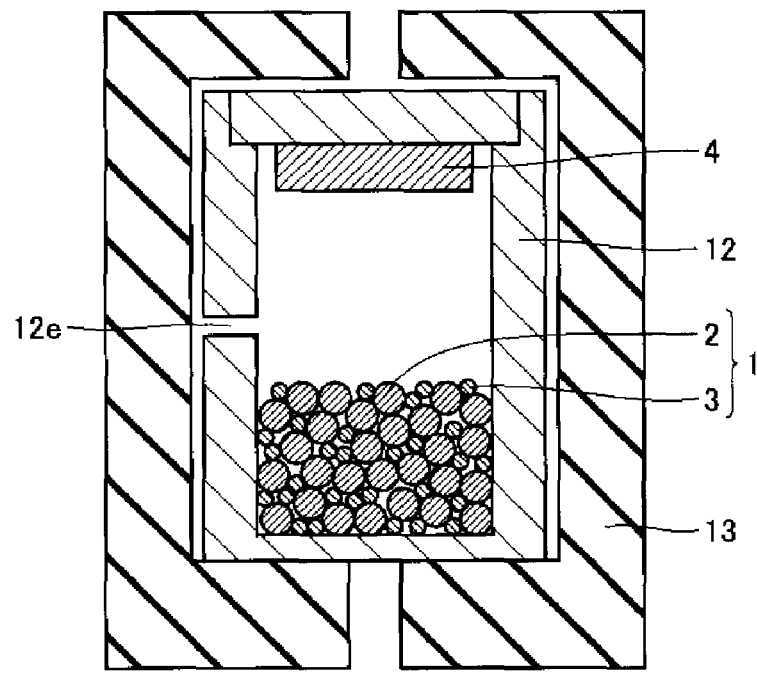
FIG. 2 is a cross-sectional schematic diagram for illustrating key features of a different mode of embodying a III-nitride single-crystal growth method involving the present invention.
Figure 3:
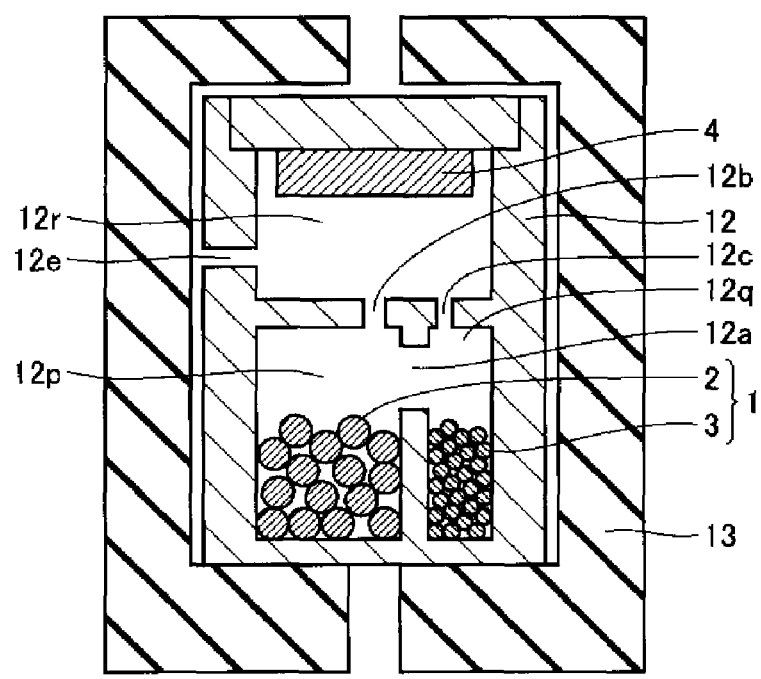
FIG. 3 is a cross-sectional schematic diagram for illustrating key features of a still different mode of embodying a III-nitride single-crystal growth method involving the present invention.

Herein, it is sufficient that the source material 1 includes the $Al_yGa_{1-y}N$ source material 2 and at least a single kind of impurity element 3 selected from the group consisting of IVb elements and IIa elements, and the manner in which they are included in the source material is not limited. Therefore, the $Al_yGa_{1-y}N$ source 2 collectively and the impurity element 3 collectively may be each arranged in the crucible 12, as illustrated in FIG. 1. Also as illustrated in FIG. 2, the $Al_yGa_{1-y}N$ source 2 and impurity element 3 may be arranged mixed together in the crucible 12. Furthermore, as illustrated in FIG. 3, with a first and a second source material compartments 12p, 12q where gases in the compartments can be exchanged via a ventilation opening 12a being provided in the crucible 12, the $Al_yGa_{1-y}N$ source material 2 may be arranged in the first source material compartment 12p, and the impurity element 3 in the second source material compartment 12q.

Moreover, what form the $Al_yGa_{1-y}N$ source material 2 and impurity element 3 have is not particularly limited as long as the $Al_yGa_{1-y}N$ source material 2 and impurity element 3 are in the form that enables controlling their relative proportions—that is, if in solid form, they may be block-like, granular, and powdery. It should be understood that in the situation in which the crucible 12, and the source material compartments 12p, 12q and crystal-growth compartment 12r that will be explained hereinafter are formed of the impurity element 3, the concentration of the impurity element 3 cannot be controlled, which prevents above impurity element effect from being brought during $Al_xGa_{1-x}N$ single crystal growth. Additionally, the chemical composition of the $Al_yGa_{1-y}N$ source material 2 and that of the $Al_xGa_{1-x}N$ single crystal 4 produced from it coincides with each other when x=y=1, but generally differ from each other except when x=y=1 in accordance with the conditions on which the $Al_yGa_{1-y}N$ source is sublimated, and with the conditions on which the $Al_xGa_{1-x}N$ single crystal 4 is grown. Once the sublimation conditions on the $Al_yGa_{1-y}N$ source and the growth conditions on the $Al_xGa_{1-x}N$ single crystal 4 are defined, what chemical composition of the $Al_yGa_{1-y}N$ source material 2 is required to produce the $Al_xGa_{1-x}N$ single crystal having the given chemical composition is determined.

Herein, the sublimation method utilized in this embodiment means the method in which, referring to FIG. 1, the source material 1 including the $Al_yGa_{1-y}N$ source 2 is sublimated, and then is solidified again to produce the $Al_xGa_{1-x}N$ single crystal 4. During sublimation crystal growth, a vertical high-frequency-heating sublimation furnace 10 as illustrated in FIG. 1 is employed, for example. The WC crucible 12 having a ventilation opening 12e is disposed in the center part of a reaction chamber 11 in the vertical sublimation furnace 10, with a heater 13 being provided around the crucible 12 so that ventilation from the inside of, to the outside of, the crucible 12 is secured. Furthermore, high-frequency heating coils 14 for heating the heater 13 are disposed centrally along the outer side of the reaction chamber 11. Additionally, an $N_2$ gas inlet 11a for passing $N_2$ gas into the reaction chamber 11 outside of the crucible 12, an outlet 11c, and radiation thermometers 15 for measuring the temperatures of the bottom and top sides of the crucible 12 are provided to the ends of the reaction chamber 11.

Referring to FIG. 1, in the following manner, the $Al_xGa_{1-x}N$ single crystal 4 can be manufactured employing the above vertical sublimation furnace 10. The source material 1 including the $Al_yGa_{1-y}N$ source 2 and impurity element 3 are housed in the lower part of the crucible 12, and with the $N_2$ gas being continuously passed into the reaction chamber 11, the temperature in the crucible 12 is raised by heating the heater 13 employing the high-frequency heating coils 14, and the temperature of the part in the crucible 12 where the source material 1 is housed is kept higher than that of the rest in the crucible 12, to sublimate the $Al_xGa_{1-x}N$ and impurity element in the source material 1, and then the $Al_xGa_{1-x}N$ is solidified again in the upper part of the crucible 12 to grow the $Al_xGa_{1-x}N$ single crystal 4.

Herein, as a result of, during the growth of the $Al_xGa_{1-x}N$ single crystal 4, bringing the temperature of the part in the crucible 12 where the source material 1 is housed to a level of 1600° C to 2300° C, and making the temperature of the upper part in the crucible 12 (where the $Al_xGa_{1-x}N$ single crystal 4 is grown) approximately 10° C to 200° C lower than that of the part in the crucible 12 where the source material 1 is housed, $Al_xGa_{1-x}N$ single crystal 4 of favorable crystallinity can be obtained. Moreover, passing $N_2$ gas into the reaction chamber 11 outside the crucible 12 continuously also during crystal growth reduces the mixing of the impurities into the $Al_xGa_{1-x}N$ single crystal 4.

In addition, during temperature rising in the crucible 12, making the temperature of the part in the crucible 12 except where the source material is housed higher than that of the part in the crucible 12 where the source material 1 is housed removes impurities via the ventilation opening 12e from the crucible 12, making it possible to further reduce the mixing of the impurities into the $Al_xGa_{1-x}N$ single crystal 4.

In this embodiment mode, an impurity element is at least a single type of element selected from the group consisting of IVb elements and IIa elements. The IVb and IIa elements, which are believed to act as materials for transporting Al, heighten $Al_xGa_{1-x}N$ single crystal growth rate and enhance crystallinity. Herein, Group IVb elements mean elements categorized into Group IVb in periodic table of the elements, and C (carbon), Si (silicon), and Ge (germanium) fall into the Group IVb. On the other hand, Group IIa elements, which are called also alkaline earth metal, mean elements categorized into Group IIa in periodic table of the elements, and Mg (magnesium) and Ca (calcium) fall into the Group IIa. A plurality of impurity elements selected from the above IVb and IIa elements can be used at the same time. Selecting a plurality of elements (for example, Si and C) from IVb elements is less than optimal, however, because the selected plurality of elements (Si and C) react with each other to form a stable compound (SiC), and thus lose the effect of acting as materials for transporting Al, sometimes resulting in failure to offer advantages sufficient to heighten $Al_xGa_{1-x}N$ single crystal growth and to enhance crystallinity. It should be understood that in the present description, the periodic-table groups referred to are according to the Japanese/European systems of labeling the vertical columns segregating the chemical groupings.

Herein, the impurity element is preferably any one of Ai, C, and Ge. As to The above impurity element, any one specific element picked out from IVb Elements—particularly, Si, C, or Ge among them—is preferable from the Perspective of heightening $Al_xGa_{1-x}N$ single crystal growth rate and of enhancing crystallinity.

In source material 1 of this embodiment, ratio $n_E/n_A$ (simply, molar ratio $n_E/n_A$, hereinafter) of the number of moles $n_E$ of the atoms of the impurity element 3 to the number of moles $n_A$ of the Al atoms in the $Al_yGa_{1-y}N$ source 2 is preferably between 0.01 and 0.5 inclusive, and more preferably, is between 0.05 and 0.5 inclusive. At a molar ratio $n_E/n_A$ of less than 0.01, the impurity element has an attenuated effect of acting as material for transporting Al, and at a molar ratio $n_E/n_A$ of more than 0.5, growth of the $Al_xGa_{1-x}N$ single crystal 4 is blocked.

Furthermore, ratio $n_E/n_O$ (simply, molar ratio $n_E/n_O$, hereinafter) of the number of moles $n_E$ of the atoms of the impurity element 3 to the number of moles $n_O$ of the atoms of oxygen contained in the source material 1 is preferably between 2 and $1 \times 10^4$ inclusive. Because a molar ratio $n_E/n_O$ of less than 2 causes the relative number of moles of the atoms of the impurity elements 3 to be small, making the impurity element 3 as material for transporting Al less effective, and a molar ratio $n_E/n_O$ of more than $1 \times 10^4$ makes the relative number of moles of the atoms of the impurity element 3 much too great, both molar ratio ranges block the growth of the $Al_xGa_{1-x}N$ single crystal. Form this perspective, the molar ratio $n_E/n_O$ is preferably between 3 and $1 \times 10^4$ inclusive, and more preferably, is between 10 and $1 \times 10^4$ inclusive. Herein, the number of moles of the atoms of oxygen contained in the source material 1 is calculated from the production of carbon monoxide generated by reacting the predetermined amount of the source material 1 with an excessive amount of carbon.

Furthermore, the atoms of oxygen contained in the source material 1 sometimes reduce above effect, of the action of the impurity element 3, that the present invention intends, as well as directly block the growth of the $Al_xGa_{1-x}N$ single crystal 4. For this reason, oxygen mole content $\alpha_{MO}$, in the source material 1, defined by $\alpha_{MO}=100 \times n_O/n_M$ employing the number of moles $n_M$ of the $Al_yGa_{1-y}N$ source 2 included in the source material 1 and the number of moles $n_O$ of the atoms of oxygen contained in the source material 1 is preferably 1 mole % or less, and more preferably, 0.1 mole % or less.

In this embodiment mode, in both particular situations in which the number of moles $n_E$ of atoms of the impurity element 3 with respect to the number of moles $n_A$ of Al the atoms in the $Al_yGa_{1-y}N$ source 2 is particularly small (for example, the molar ratio $n_E/n_A$ is less than 0.01), and in which the number of moles $n_E$ of atoms of the impurity element 3 with respect to the number of moles $n_O$ of the atoms of oxygen contained in the $Al_yGa_{1-y}N$ source 2 is small (for example, a molar ratio $n_E/n_O$ is less than 3), stable crystal growth is prevented to cause lower crystal growth rate, resulting in crystallinity degradation.

Herein, the impurity element 3 can be used in form of various compounds, in addition to form of single elemental substance. Oxides are not preferable, however, because they block crystal growth—for example, they increases oxygen content in the whole source material 1, and makes the above action the present invention intends of the impurity element 3 less effective.

Additionally, in this embodiment mode, the source material 1 in which the impurity element 3 is added to the $Al_yGa_{1-y}N$ source 2 can be heat-treated prior to growth of the $Al_xGa_{1-x}N$ single crystal 4. Form the perspective of reducing any one specific element picked out from IVb element, and impurity element, excluding the impurity element 3, selected from the group consisting of IIa elements, and of activating the impurity element 3 in the source material 1 and improving dispersibility, heat-treating the source material 1 prior to the crystal growth is preferable. In the implementation of the heat-treatment of the source material 1 prior to the crystal growth, in the source material 1 that has undergone heat-treatment prior to crystal growth, ratio of the number of moles $n_E$ of the atoms of the impurity element 3 to the number of moles $n_A$ of the Al atoms in the $Al_yGa_{1-y}N$ source 2 (that is, molar ratio $n_E/n_A$), oxygen mole content $\alpha_{MO}$ in the source material 1, and ratio of the number of moles $n_E$ of the atoms of the impurity element 3 to the number of moles $n_O$ of the atoms of oxygen contained in the source material 1 (that is, molar ratio $n_E/n_O$) preferably fall within above ranges.

Moreover, in this embodiment mode, the crucible 12 is not particularly limited, but from the perspective of stably growing the $Al_xGa_{1-x}N$ single crystal 4, the crucible 12 is preferably formed from materials that do not react with the $Al_yGa_{1-y}N$ source 2 or impurity element 3, or that suffer little degradation during growth of the $Al_xGa_{1-x}N$ single crystal 4 without discharging the impurity element 3 into the atmosphere in which crystal is grown, and preferably, is formed particularly from metal carbide. Preferable examples of the metal carbide for forming the crucible 12 include TiC, XrC, NbC, TaC, MoC, and WC In case that principally because the impurity element 3 is discharged into the atmosphere in which crystal is grown, it is unintentionally provided to growing crystal, there is a possibility that content of the impurity element 3 in the atmosphere varies during crystal growth (for example, the content gradually overages), and thus crystal growth is blocked.

Embodiment Mode 2

Another embodiment mode of the III-nitride single crystal growth method involving the present invention is common to Embodiment Mode 1 in being provided with, referring to FIGS. 1 and 2, the step of arranging the source material 1 in the crucible 12 and the step of sublimating the source material 1 to grow the $Al_xGa_{1-x}N$ single crystal 4 in the crucible 12, and in that the source material 1 includes the $Al_yGa_{1-y}N$ source 2 and the impurity element 3, and the impurity 3 is at least one selected from the group consisting of IVb elements and IIa elements.

From Embodiment mode 1 in which the $Al_yGa_{1-y}N$ source 2 collectively and the impurity element 3 collectively are each arranged in the crucible 12, however, this embodiment mode differs in that, referring to FIG. 2, the source material 1 in which the $Al_yGa_{1-y}N$ source 2 and impurity element 3 are mixed together is arranged in crucible 12 in the above step.

Because the material source 1 arranged in the crucible 12 in this embodiment mode is a mixture of the $Al_yGa_{1-y}N$ source 2 and impurity element 3, the distribution of the $Al_yGa_{1-y}N$ gas source and impurity element gas within the crucible 12 after the sublimation of the source material 1 is more readily uniformed, and thus the $Al_xGa_{1-x}N$ single crystal 4 is more stably grown.

Herein, preferably also in this embodiment mode, as in Embodiment Mode 1, the impurity element is any one of Si, C and Ge, molar ratio $n_E/n_A$ is from 0.01 to 0.5 inclusive, molar ratio $n_E/n_O$ is from 3 to $1 \times 10^4$ inclusive, and the crucible 12 is composed of metal carbide.

Embodiment Mode 3

A further embodiment mode of the III-nitride single crystal growth method involving the present invention is common to Embodiment Mode 1, referring to FIGS. 1 and 3, in being provided with the step of arranging the source material 1 in the crucible 12 and the step of sublimating the source material 1 to grow the $Al_xGa_{1-x}N$ single crystal 4 in the crucible 12, an in that the source material 1 includes the $Al_yGa_{1-y}N$ source 2 and the impurity element 3, and the impurity 3 is at least one selected from the group consisting of IVb elements and IIa elements.

From Embodiment Mode 1 in which the $Al_yGa_{1-y}N$ source 2 collectively and the impurity element 3 collectively are each arranged in the crucible 12, and from Embodiment Mode 2 in which the $Al_yGa_{1-y}N$ source 2 and impurity element 3 are arranged mixed together in the crucible 12, however, this embodiment mode differs in that, referring to FIG. 3, the first source material compartment 12p, second source material compartment 12q and crystal-growth compartment 12r are provided in the crucible 12, with the ventilation openings 12a, 12b, and 12c being provided between the first and the second source material compartments 12p, 12q, and between at least one of them and the crystal-growth compartment 12r, and the $Al_yGa_{1-y}N$ source 2 is arranged in the first source material compartment 12p, with the impurity element 3 being arranged in the second source material compartment 12q.

Because in this embodiment mode, the $Al_yGa_{1-y}N$ source 2 and impurity element 3 are arranged respectively in the first and second source material compartments 12p, 12q where gases in the compartments can be exchanged via the ventilation opening 12a, the distribution of the $Al_yGa_{1-y}N$ gas source and impurity element gas within the crucible 12 in which the source material 1 has sublimated can made more uniform without direct contact between the $Al_yGa_{1-y}N$ source 2 and impurity element 3, enabling more stable growth of the $Al_xGa_{1-x}N$ single crystal 4.

Herein, FIG. 3 illustrates the example in which the ventilation openings 12a, 12b, and 12c are provided respectively between the first and the second source material compartments 12p, 12q, between the first source material compartment 12p and the crystal-growth compartment 12r, and between the second source material compartment 12q and the crystal-growth compartment 12r, but in this embodiment mode, as to ventilation openings 12b and 12c, advantageously at least one of them may be provided.

In addition, preferably also in this embodiment mode, as in Embodiment Modes 1 and 2, the impurity element is any one of Si, C and Ge, molar ratio $n_E/n_A$ is from 0.01 to 0.5 inclusive, molar ratio $n_E/n_O$ is from 2 to $1 \times 10^4$ inclusive, and the crucible 12 is formed from metal carbide.

Embodiment Mode 4

Figure 4:
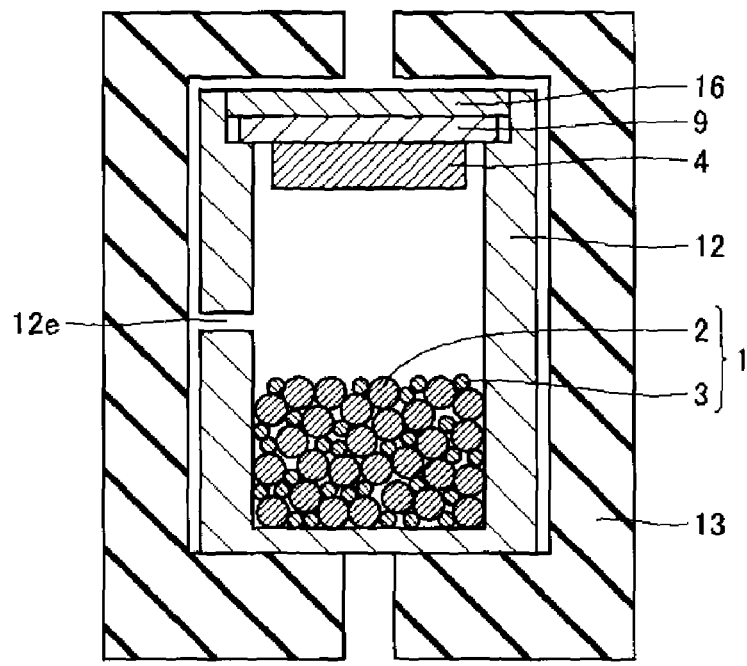
FIG. 4 is a cross-sectional schematic diagram for illustrating key features of yet a different mode of embodying a III-nitride single-crystal growth method involving the present invention.

Yet another embodiment mode of the III-nitride single crystal growth method involving the present invention is common to Embodiment Mode 1, referring to FIGS. 1 and 4, in being provided with the step of arranging the source material 1 in the crucible 12 and the step of sublimating the source material 1 to grow the $Al_xGa_{1-x}N$ single crystal 4 in the crucible 12, and in that the source material 1 includes the $Al_yGa_{1-y}N$ source 2 and impurity element 3, and the impurity 3 is at least one selected from the group consisting of IVb elements and IIa elements.

From Embodiment Modes 1 through 3 in which no undersubstrate is arranged in the crucible 12 and the $Al_xGa_{1-x}N$ single crystal 4 is grown on the opposite end of the crucible 12 from the end where the source material 1 is arranged, however, this embodiment mode differs in that, referring to FIG. 4, an undersubstrate 9 is also placed in the crucible 12 and the $Al_xGa_{1-x}N$ single crystal 4 is grown on the undersubstrate 9. Herein, although FIG. 4 shows that the source material 1 in which the $Al_yGa_{1-y}N$ source 2 and impurity element 3 has been mixed is arranged in the crucible 12 (the source material 1 is arranged in the same manner as in Embodiment Mode 2), as to how to arrange the source material, the same manners as in Embodiment Mode 1 and 3 can be adopted.

In this embodiment mode, growing the $Al_xGa_{1-x}N$ single crystal 4 onto the undersubstrate 9 enables more stable growth of the $Al_xGa_{1-x}N$ single crystal 4. Herein, the undersubstrate 9 is not particularly limited as long as the $Al_xGa_{1-x}N$ single crystal 4 can be grown on it, so it may be any of a native substrate same with, and a non-native substrate different from, $Al_xGa_{1-x}N$ single crystal in chemical composition. From the perspective of improving crystallinity, a non-native substrate slightly differing from a native substrate or $Al_xGa_{1-x}N$ single crystal in lattice constant is preferable. Furthermore, from the perspective of producing bulk $Al_xGa_{1-x}N$ single crystal, the undersubstrate 9 is preferably a bulk substrate large in diameter. Form this perspective, SiC, $Al_2O_3$, GaN substrates are preferably utilized.

In this embodiment mode, employing an undersubstrate with a diameter of 2 inches or more enables growth of a bulk $Al_xGa_{1-x}N$ single crystal having a diameter of 2 inches or more. It should be understood that in manufacturing crystals, substrates, and other wafers, wafers with a diameter of 1 inch, 2 inches, 4 inches, and other predetermined sizes are generally manufactured. That is to say, although 1 inch is 2.54 cm in unit conversion, a diameter of 2 inches means one of the sizes representing a diameter of wafers such as substrates and crystals, so that diameter, which is not limited exactly to 5.08 cm, includes manufacturing errors.

In addition, preferably also in this embodiment mode, as in Embodiment Modes 1 through 3, the impurity element is any one of Si, C, and Ge, molar ratio $n_E/n_A$ is from 0.01 to 0.5 inclusive, molar ratio $n_E/n_O$ is from 3 to $1 \times 10^4$ inclusive, and the crucible 12 is formed from metal carbide.

Embodiment Mode 5

Figure 5:
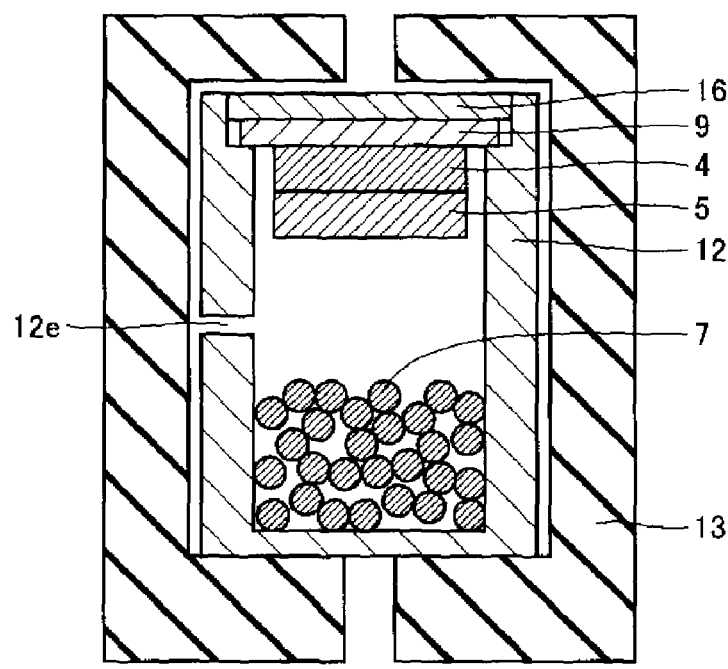
FIG. 5 is a cross-sectional schematic diagram for illustrating key features of another different mode of embodying a III-nitride single-crystal growth method involving the present invention.
Figure 6:
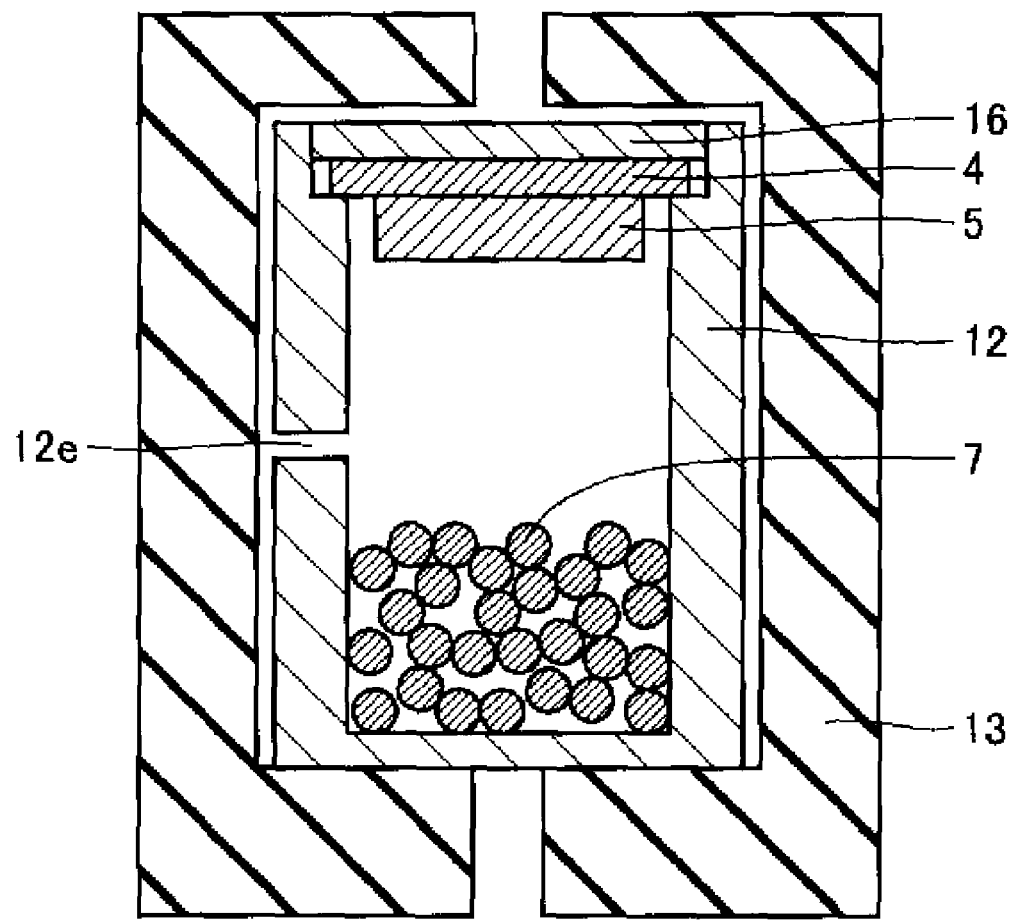
FIG. 6 is a cross-sectional schematic diagram for illustrating key features of a further different embodiment mode of the III-nitride single crystal growth method involving the present invention.

Still another embodiment mode of the III-nitride single crystal growth method involving the present invention is further furnished with a step of, referring to FIGS. 1, 5, and 6, sublimating $Al_tGa_{1-t}N$ ($0<t\leq1$) source 7 to grow onto the $Al_xGa_{1-x}N$ single crystal 4 grown by any of the growth methods in embodiment modes 1 through 4 a $Al_sGa_{1-s}N$ ($0<s\leq1$) single crystal (5) with a lower concentration of the impurity element 3 compared with $Al_xGa_{1-x}N$ single crystal 4.

In this embodiment mode, an $Al_{x2}Ga_{1-x2}N$ single crystal 5 having favorable crystallinity, low concentration of the contained impurity element 3, and high general versatility can be grown onto the $Al_xGa_{1-x}N$ single crystal 4 of favorable crystallinity. Herein, the type and concentration of impurity element contained in the $Al_xGa_{1-x}N$ single crystal 4 and $Al_sGa_{1-s}N$ single crystal 5 can be measured by secondary ion mass spectroscopy (SIMS).

In this embodiment mode, the step of sublimating the $Al_tGa_{1-t}N$ ($0<t\leq1$) source 7 to grow onto the $Al_xGa_{1-x}N$ single crystal 4 the $Al_sGa_{1-s}N$ ($0<s\leq1$) single crystal 5 having a lower concentration of the contained impurity element 3 compared with the $Al_xGa_{1-x}N$ single crystal 4 is not particularly limited, so the step can be performed with, referring to FIGS. 5 and 6, the $Al_tGa_{1-t}N$ source 7, not above impurity element, being arranged as source material in the crucible 12. Herein, referring to FIG. 5, $Al_sGa_{1-s}N$ single crystal is further grown onto the $Al_xGa_{1-x}N$ single crystal 4 that has been grown onto the undersubstrate 9. Moreover, referring to FIG. 6, the grown $Al_xGa_{1-x}N$ single crystal 4 is processed into a substrate, and then the $Al_sGa_{1-s}N$ single crystal 5 is further grown onto the this substrate.

Additionally, the $Al_sGa_{1-s}N$ single crystal grown on the $Al_xGa_{1-x}N$ single crystal may be same (s=x) with, and be different (s≠x) from, the $Al_xGa_{1-x}N$ single crystal 4 in chemical composition. From the perspective of growing $Al_sGa_{1-s}N$ single crystal of favorable crystallinity, however, the chemical composition of the $Al_sGa_{1-s}N$ single crystal is preferably close to, and more preferably, similar to, that of the $Al_xGa_{1-x}N$ single crystal. The chemical composition of the $Al_tGa_{1-t}N$ source 7 and that of the $Al_sGa_{1-s}N$ single crystal 5 produced from it are same with each other when s=t=1, but differ from each other except when s=t=1 generally in accordance with the conditions on which the $Al_tGa_{1-t}N$ source 7 is sublimated, and with the conditions on which the $Al_sGa_{1-s}N$ single crystal 5 is grown. Once the sublimation conditions on the $Al_tGa_{1-t}N$ source 7 and growth conditions on the $Al_sGa_{1-s}N$ single crystal 5 are determined, the chemical composition of the $Al_tGa_{1-t}N$ source 7 for producing the $Al_sGa_{1-s}N$ single crystal 5 of the predetermined chemical composition is defined.

EMBODIMENTS

Embodiment 1

Referring to FIGS. 1 and 4, AlN powder (the $Al_yGa_{1-y}N$ source 2) and Si powder (the impurity element 3) were mixed so that molar ratio $n_E/n_A$ of Si atoms (atoms of the impurity element 3) in the Si powder to Al atoms in the AlN powder (the $Al_yGa_{1-y}N$ source 2) was made 0.05, and were arranged as the source material 1 in the bottom part of the WC crucible 12. Furthermore, a SiC substrate 2 inches (5.08 cm) in diameter was arranged as the undersubstrate 9 in the top part of the crucible 12. Herein, oxygen mole percent $\alpha_{MO}$ in the AlN powder and Si powder (the source material 1) was 0.1, and molar ratio $n_E/n_O$ of Si atoms (atoms of the impurity element 3) of the Si powder to the atoms of oxygen contained in the AlN powder and Si powder (source material 1) was 20. In addition, WC material that is an undersubstrate protector 16 is closely attached to the back side of the SiC substrate (the undersubstrate 9).

Next, with $N_2$ gas being continuously passed into the reaction chamber 11, the temperature in the crucible 12 was raised employing the high-frequency coils 14. While the temperature in the crucible 12 was rising, with temperature in the part of the crucible 12 where the SiC substrate (the undersubstrate 9) was arranged being kept higher than that in the part of the crucible 12 where the source material 1 was arranged, the front side of the SiC substrate (the undersubstrate 9) was cleaned by means of etching, and at the same time the impurities discharged from the SiC substrate (the undersubstrate 9) and the inside of the crucible 12 were removed though the ventilation opening 12e.

Subsequently, the temperature in the part of the crucible 12 where the source material 1 was arranged was brought to 2100° C, and the temperature in the part of the crucible 12 where the SiC substrate (the undersubstrate 9) was arranged was brought to 2000° C, to sublimate AlN and C from the source material 1, and the AlN was solidified again on the SiC substrate (the undersubstrate 9) arranged in the top part of the crucible 12 to grow AlN single crystal (the $Al_xGa_{1-x}N$ single crystal 4). The $N_2$ gas was passed into the reaction chamber outside the crucible 12 continuously also during AlN single crystal (the $Al_xGa_{1-x}N$ single crystal 4) growth, and the amount of $N_2$ gas introduction and emission is controlled so that the partial pressure of gas in the reaction chamber 11 outside the crucible 12 is brought to a level of 101.3 hPa to 1013 hPa. After 30 h AlN crystal (the $Al_xGa_{1-x}N$ single crystal 4) growth under above crystal growth conditions, the crucible 12 was cooled to room temperature, and thus the AlN crystal was obtained.

The obtained AlN single crystal (the $Al_xGa_{1-x}N$ single crystal 4) was a large 2 inches (5.08 cm) in diameter×4 mm in thickness with a uniform thickness, and its growth rate was 133 µm/hr. The full-width at half-maximum of X-ray diffraction peak on the AlN single crystal (0002) face was a small 70 arc sec, and crystallinity was satisfactory. Furthermore, the AlN single crystal dislocation density, which was calculated by etch-pit density (EPD: the method of calculating as dislocation density the density of pits forming on front side as a result of etching), was a low $5.0 \times 10^5$ cm$^{-2}$. The results are set forth in Table I.

Comparative Example 1

Apart from utilizing as the source material 1 only AlN powder (the $Al_yGa_{1-y}N$ source 2) in which the impurity element 3 was not included, AlN single crystal (the $Al_xGa_{1-x}N$ single crystal 4) was grown in the same manner as in Embodiment 1. Although the obtained AlN single crystal (the $Al_xGa_{1-x}N$ single crystal 4) was 2 inches (5.08 cm) in diameter, its thickness is nonuniform—0.4 mm on average—and its growth rate was 13 µm/hr. In addition, areas in which AlN single crystal had not grown were found on the SiC substrate (the undersubstrate 9). The full-width at half-maximum of X-ray diffraction peak on the AlN single crystal (0002) face was a great 500 arc sec, and the crystallinity was spoiled. Furthermore, polycrystallization was scattered in some areas on the AlN single crystal (0002) face. Moreover, the AlN single crystal dislocation density was a high at $1.0 \times 10^9$ cm$^{-2}$. The results are set forth in Table I.

Embodiment 2

Apart from employing as the source material 1 the mixture in which the AlN powder (the $Al_yGa_{1-y}N$ source 2) and Si powder (impurity element 3) were mixed so that molar ratio $n_E/n_A$ of Si atoms in the Si powder to Al toms in the AlN powder was 0.01 (oxygen mole percent $\alpha_{MO}$ in the source material 1 was 0.1 mol %, and molar ratio $n_E/n_O$ of Si atoms in the Si powder to the atoms of oxygen contained in the source material 1 was 4), AlN single crystal (the $Al_xGa_{1-x}N$ single crystal 4) was grown in the same manner as in Embodiment 1. The obtained AlN single crystal (the $Al_xGa_{1-x}N$ single crystal 4) was a large 2 inches (5.08 cm) in diameter×3 mm in thickness with a uniform thickness, and its growth rate was 100 µm/hr. The full-width at half-maximum of X-ray diffraction peak on the AlN single crystal (0002) face was a small 500 arc sec, and crystallinity was satisfactory. Furthermore, the AlN single crystal dislocation density was a low $6.0 \times 10^5$ cm$^{-2}$. The results are set forth in Table I.

Embodiment 3

Apart from employing as the source material 1 the mixture in which AlN powder (the $Al_yGa_{1-y}N$ source 2) and Si powder (the impurity element 3) were mixed so that molar ratio $n_E/n_A$ of Si atoms in the Si powder to Al toms in the AlN powder was 0.3 (oxygen mole percent $\alpha_{MO}$ in the source material 1 was 0.1 mol %, and molar ratio $n_E/n_O$ of Si atoms in the Si powder to the atoms of oxygen contained in the source material 1 was 60), AlN single crystal (the $Al_xGa_{1-x}N$ single crystal 4) was grown in the same manner as in Embodiment 1. The obtained AlN single crystal (the $Al_xGa_{1-x}N$ single crystal 4) was a large 2 inches (5.08 cm) in diameter×4.5 mm in thickness with a uniform thickness, and its growth rate was 150 µm/hr. The full-width at half-maximum of X-ray diffraction peak on the AlN single crystal (0002) face was a small 100 arc sec, and crystallinity was satisfactory. Furthermore, the AlN ingle crystal dislocation density was a low $7.0 \times 10^5$ cm$^{-2}$. The results are set forth in Table I.

Embodiment 4

Apart from employing as the source material 1 the mixture in which AlN powder (the $Al_yGa_{1-y}N$ source 2) and Si powder (the impurity element 3) were mixed so that molar ratio $n_E/n_A$ of Si atoms in the Si powder to Al toms in the AlN powder was 0.5 (oxygen mole percent $\alpha_{MO}$ in the source material 1 was 0.1 mol %, and molar ratio $n_E/n_O$ of Si atoms in the Si powder to the atoms of oxygen contained in the source material 1 was 200), AlN single crystal (the $Al_xGa_{1-x}N$ single crystal 4) was grown in the same manner as in Embodiment 1. The obtained AlN single crystal (the $Al_xGa_{1-x}N$ single crystal 4) was a large 2 inches (5.08 cm) in diameter×5 mm in thickness with a uniform thickness, and its growth rate was 166 µm/hr. The full-width at half-maximum of X-ray diffraction peak on the AlN single crystal (0002) face was a small 120 arc sec, and crystallinity was satisfactory. Furthermore, the AlN single crystal dislocation density was a low $8.0\times10^5$ $cm^{-2}$. The results are set forth in Table I.

Embodiment 5

Apart from employing as the source material 1 the mixture in which AlN powder (the $Al_yGa_{1-y}N$ source 2) and C (carbon) powder (the impurity element 3) were mixed so that molar ratio $n_E/n_A$ of C atoms in the C powder to Al toms in the AlN powder was 0.01 (oxygen mole percent $\alpha_{MO}$ in the source material 1 was 0.1 mol %, and molar ratio $n_E/n_O$ of C atoms in the C powder to atoms in the oxygen contained in the source material 1 was 4), AlN single crystal (the $Al_xGa_{1-x}N$ single crystal 4) was grown in the same manner as in Embodiment 1. The obtained AlN single crystal (the $Al_xGa_{1-x}N$ single crystal 4) was a large 2 inches (5.08 cm) in diameter×4.8 mm in thickness with a uniform thickness, and its growth rate was 150 µm/hr. The full-width at half-maximum of X-ray diffraction peak on the AlN single crystal (0002) face was a small 45 arc sec, and crystallinity was satisfactory. Furthermore, the AlN single crystal dislocation density was a low $9.0\times10^4$ $cm^{-2}$. The results are set forth in Table I.

Embodiment 6

Apart from employing as the source material 1 the mixture in which AlN powder (the $Al_yGa_{1-y}N$ source 2) and C (carbon) powder (the impurity element 3) were mixed so that molar ratio $n_E/n_A$ of C atoms in the C powder to Al toms in the AlN powder was 0.05 (oxygen mole percent $\alpha_{MO}$ in the source material 1 was 0.1 mol %, and the molar ratio $n_E/n_O$ of C atoms in the C powder to atoms of the oxygen contained in the source material 1 was 20), AlN single crystal (the $Al_xGa_{1-x}N$ single crystal 4) was grown in the same manner as in Embodiment 1. The obtained AlN single crystal (the $Al_xGa_{1-x}N$ single crystal 4) was a large 2 inches (5.08 cm) in diameter×9 mm in thickness with a uniform thickness, and its growth rate was 300 µm/hr. The full-width at half-maximum of X-ray diffraction peak on the AlN single crystal (0002) face was a small 30 arc sec, and crystallinity was satisfactory. Furthermore, the AlN single crystal dislocation density was a low $5.0\times10^4$ $cm^{-2}$. The results are set forth in Table I.

Embodiment 7

Apart from employing as the source material 1 the mixture in which AlN powder (the $Al_yGa_{1-y}N$ source 2) and C (carbon) powder (the impurity element 3) were mixed so that molar ratio $n_E/n_A$ of C atoms in the C powder to Al toms in the AlN powder was 0.3 (oxygen mole percent $\alpha_{MO}$ in the source material 1 was 0.1 mol %, and molar ratio $n_E/n_O$ of C atoms in the C powder to atoms of the oxygen contained in the source material 1 was 60), AlN single crystal (the $Al_xGa_{1-x}N$ single crystal 4) was grown in the same manner as in Embodiment 1. The obtained AlN single crystal (the $Al_xGa_{1-x}N$ single crystal 4) was a large 2 inches (5.08 cm) in diameter×10.5 mm in thickness with a uniform thickness, and its growth rate was 350 µm/hr. The full-width at half-maximum of X-ray diffraction peak on the AlN single crystal (0002) face was a small 30 arc sec, and crystallinity was satisfactory. Furthermore, the AlN single crystal dislocation density was a low $6.0\times10^4$ $cm^{-2}$. The results are set forth in Table I.

Embodiment 8

Apart from employing as the source material 1 the mixture in which AlN powder (the $Al_yGa_{1-y}N$ source 2) and C (carbon) powder (the impurity element 3) were mixed so that the molar ratio $n_E/n_A$ of C atoms in the C powder to Al toms in the AlN powder was 0.5 (oxygen mole percent $\alpha_{MO}$ in the source material 1 was 0.1 mol %, and molar ratio $n_E/n_O$ of C atoms in the C powder to atoms of the oxygen contained in the source material 1 was 200), AlN single crystal (the $Al_xGa_{1-x}N$ single crystal 4) was grown in the same manner as in Embodiment 1. The obtained AlN single crystal (the $Al_xGa_{1-x}N$ single crystal 4) was a large inches (5.08 cm) in diameter×12 mm in thickness with a uniform thickness, and its growth rate was 400 µm/hr. The full-width at half-maximum of X-ray diffraction peak on the AlN single crystal (0002) face was a small 45 arc sec, and crystallinity was satisfactory. Furthermore, the AlN single crystal dislocation density was a low $1.0\times10^5$ $cm^{-2}$. The results are set forth in Table I.

TABLE I

| | | Comp. Ex. 1 | Emb. 1 | Emb. 2 | Emb. 3 | Emb. 4 | Emb. 5 | Emb. 6 | Emb. 7 | Emb. 8 |
|---|---|---|---|---|---|---|---|---|---|---|
| Single crystal growth conditions | $Al_yGa_{1-y}N$ source [A] | AlN | AlN | AlN | AlN | AlN | AlN | AlN | AlN | AlN |
| | Impurity element [E] | — | Si | Si | Si | Si | C | C | C | C |
| | Molar ratio $n_E/n_A$ | — | 0.05 | 0.01 | 0.3 | 0.5 | 0.01 | 0.05 | 0.3 | 0.5 |
| | Molar ratio $n_E/n_O$ | — | 20 | 4 | 60 | 200 | 4 | 20 | 60 | 200 |
| | Oxygen mole percent $\alpha_{MO}$ (mole %) | 0.1 | 0.1 | 0.1 | 0.1 | 0.1 | 0.1 | 0.1 | 0.1 | 0.1 |
| Single crystal characteristics | $Al_xGa_{1-x}N$ single crystal | AlN | AlN | AlN | AlN | AlN | AlN | AlN | AlN | AlN |
| | Crystal thickness (mm) | 0.4 | 4 | 3 | 4.5 | 5 | 4.8 | 9 | 10.5 | 12 |
| | Crystal growth rate (µm/hr) | 13 | 133 | 100 | 150 | 166 | 150 | 300 | 350 | 400 |
| | Full-width at half-maximum of X-ray diffraction peak on (0002) face (arcsec) | 500 | 70 | 120 | 100 | 120 | 45 | 30 | 30 | 45 |
| | Dislocation density ($cm^{-2}$) | $1.0\times10^9$ | $5.0\times10^5$ | $6.0\times10^5$ | $7.0\times10^5$ | $8.0\times10^5$ | $9.0\times10^4$ | $5.0\times10^4$ | $6.0\times10^4$ | $1.0\times10^5$ |
| | Remarks | Film thickness nonuniform Scattered polycrystals | | | | | | | | |

Embodiment 9

Apart from employing as the source material 1 the mixture in which AlN powder (the $Al_yGa_{1-y}N$ source 2) and Ge powder (the impurity element 3) were mixed so that molar ratio $n_E/n_A$ of Ge atoms in the Ge powder to Al toms in the AlN powder was 0.05 (oxygen mole percent $\alpha_{MO}$ in the source material 1 was 0.1 mol %, and molar ratio $n_E/n_O$ of Ge atoms in the Ge powder to atoms of the oxygen contained in the source material 1 was 20), AlN single crystal (the $Al_xGa_{1-x}N$ single crystal 4) was grown in the same manner as in Embodiment 1. The obtained AlN single crystal (the $Al_xGa_{1-x}N$ single crystal 4) was a large 2 inches (5.08 cm) in diameter×6 mm in thickness with a uniform thickness, and its growth rate was 200 μm/hr. The full-width at half-maximum of X-ray diffraction peak on the AlN single crystal (0002) face was a small 50 arc sec, and crystallinity was satisfactory. Furthermore, the AlN single crystal dislocation density was a low $8.0 \times 10^4$ $cm^{-2}$. The results are set forth in Table II.

Embodiment 10

Apart from employing as the source material 1 the mixture in which AlN powder (the $Al_yGa_{1-y}N$ source 2) and Ca powder (the impurity element 3) were mixed so that molar ratio $n_E/n_A$ of Ca atoms in the Ca powder to Al toms in the AlN powder was 0.05 (oxygen mole percent $\alpha_{MO}$ in the source material 1 was 0.1 mol %, and molar ratio $n_E/n_O$ of Ca atoms in the Ca powder to atoms of the oxygen contained in the source material 1 was 20), AlN single crystal (the $Al_xGa_{1-x}N$ single crystal 4) was grown in the same manner as in Embodiment 1. The obtained AlN single crystal (the $Al_xGa_{1-x}N$ single crystal 4) was a large 2 inches (5.08 cm) in diameter×3 mm in thickness with a uniform thickness, and its growth rate was 100 μm/hr. The full-width at half-maximum of X-ray diffraction peak on the AlN single crystal (0002) face was a small 120 arc sec, and crystallinity was satisfactory. Furthermore, the AlN single crystal dislocation density was a low $6.0 \times 10^5$ $cm^{-2}$. The results are set forth in Table II.

Embodiment 11

Apart from employing as the source material 1 the mixture in which AlN powder (the $Al_yGa_{1-y}N$ source 2) and Mg powder (the impurity element 3) were mixed so that molar ratio $n_E/n_A$ of Mg atoms in the Mg powder to Al toms in the AlN powder was 0.05 (oxygen mole percent $\alpha_{MO}$ in the source material 1 was 0.1 mol %, and molar ratio $n_E/n_O$ of Mg atoms in the Mg powder to atoms of the oxygen contained in the source material 1 was 20), AlN single crystal (the $Al_xGa_{1-x}N$ single crystal 4) was grown in the same manner as in Embodiment 1. The obtained AlN single crystal (the $Al_xGa_{1-x}N$ single crystal 4) was a large 2 inches (5.08 cm) in diameter×2 mm in thickness with a uniform thickness, and its growth rate was 67 μm/hr. The full-width at half-maximum of X-ray diffraction peak on the AlN single crystal (0002) face was a small 150 arc sec, and crystallinity was satisfactory. Furthermore, the AlN single crystal dislocation density was a low $7.0 \times 10^5$ $cm^{-2}$. The results are set forth in Table II.

Embodiment 12

Apart from employing as the source material 1 the mixture in which AlN powder (the $Al_yGa_{1-y}N$ source 2) and Si and Ca powders (impurity element 3) were mixed as the source material 1 so that molar ratio $n_E/n_A$ of Si atoms in the Si powder to, and that of Ca atoms in the Ca powder to, Al atoms in the AlN powder were respectively 0.025 and 0.025 (oxygen mole percent $\alpha_{MO}$ in the source material 1 was 0.1 m mol %, and molar ratio $n_E/n_O$ of Si atoms of the Si powder to, and that of Ca atoms of the Ca powder to, atoms of the oxygen contained in the source material 1 were respectively 10 and 10), AlN single crystal (the $Al_xGa_{1-x}N$ single crystal 4) was grown in the same manner as in Embodiment 1. The obtained AlN single crystal (the $Al_xGa_{1-x}N$ single crystal 4) was a large 2 inches (5.08 cm) in diameter×4.5 mm in thickness with a uniform thickness, and its growth rate was 150 μm/hr. The full-width at half-maximum of X-ray diffraction peak on the AlN single crystal (0002) face was a small 70 arc sec, and crystallinity was satisfactory. Furthermore, the AlN single crystal dislocation density was a low $5.0 \times 10^5$ $cm^{-2}$. The results are set forth in Table II.

Embodiment 13

Apart from employing as the source material 1 the mixture in which AlN powder (the $Al_yGa_{1-y}N$ source 2) and C and Ca powders (impurity element 3) were mixed so that molar ratio $n_E/n_A$ of C atoms in the C powder to, and that of Ca atoms in the Ca powder to, Al atoms in the AlN powder was respectively 0.025 and 0.025 (oxygen mole percent $\alpha_{MO}$ in the source material 1 was 0.1 mol %, and molar ratio $n_E/n_O$ of C atoms in the C powder to, and that of Ca atoms in the Ca powder to, atoms of the oxygen contained in the source material 1 was respectively 10 and 10), AlN single crystal (the $Al_xGa_{1-x}N$ single crystal 4) was grown in the same manner as in Embodiment 1. The obtained AlN single crystal (the $Al_xGa_{1-x}N$ single crystal 4) was a large 2 inches (5.08 cm) in diameter×6 mm in thickness with a uniform thickness of 6 mm, and its growth rate was 200 μm/hr. The full-width at half-maximum of X-ray diffraction peak on the AlN single crystal (0002) face was a small 45 arc sec, and crystallinity was satisfactory. Furthermore, the AlN single crystal dislocation density was s low $8.0 \times 10^4$ $cm^{-2}$. The results are set forth in Table II.

Embodiment 14

Apart from employing as the source material 1 the mixture in which $Al_{0.65}Ga_{0.35}N$ powder (the $Al_yGa_{1-y}N$ source 2) and C powder were mixed so that molar ratio $n_E/n_A$ of C atoms in the C powder to Al atoms in the AlN powder was 0.05 (oxygen mole percent $\alpha_{MO}$ in the source material 1 was 0.1 mol %, and molar ratio $n_E/n_O$ of C atoms in the C powder to atoms of oxygen contained in the source material 1 was 20), AlN single crystal (the $Al_xGa_{1-x}N$ single crystal 4) was grown in the same manner as in Embodiment 1. The chemical composition of the obtained single crystal measured $Al_{0.8}Ga_{0.2}N$ by x-ray photoelectron Spectroscopy. That is to say, the obtained $Al_xGa_{1-x}N$ single crystal 4 included Al atoms at a greater ratio compared with that of the $Al_yGa_{1-y}N$ source 2. The possible reason is that C atoms promoted the transportation of Al. The obtained $Al_{0.8}Ga_{0.2}N$ single crystal (the $Al_xGa_{1-x}N$ single crystal 4) was a large 2 inches (5.08 cm) in diameter×8 mm in thickness with a uniform thickness, and its growth rate was 266 μm/hr. The full-width at half-maximum of X-ray diffraction peak on the AlN single crystal (0002) face was a small 50 arc sec, and crystallinity was satisfactory. Furthermore, the $Al_{0.8}Ga_{0.2}N$ single crystal dislocation density was a low $1.0 \times 10^5$ $cm^{-2}$. The results are set forth in Table II.

TABLE II

| | | Emb. 9 | Emb. 10 | Emb. 11 | Emb. 12 | Emb. 13 | Emb. 14 |
|---|---|---|---|---|---|---|---|
| Single crystal growth conditions | $Al_yGa_{1-y}N$ source [A] | AlN | AlN | AlN | AlN | AlN | $Al_{0.65}Ga_{0.35}N$ |
| | Impurity element [E] | Ge | Ca | Mg | Si, Ca | C, Ca | C |
| | Molar ratio $n_E/n_A$ | 0.05 | 0.05 | 0.05 | 0.025, 0.025 | 0.025, 0.025 | 0.05 |
| | Molar ratio $n_E/n_O$ | 20 | 20 | 20 | 10, 10 | 10, 10 | 20 |
| | Oxygen mole percent $\alpha_{MO}$ (mole %) | 0.1 | 0.1 | 0.1 | 0.1 | 0.1 | 0.1 |

TABLE II-continued

|  |  | Emb. 9 | Emb. 10 | Emb. 11 | Emb. 12 | Emb. 13 | Emb. 14 |
|---|---|---|---|---|---|---|---|
| Single crystal characteristics | $Al_xGa_{1-x}N$ single crystal | AlN | AlN | AlN | AlN | AlN | $Al_{0.8}Ga_{0.2}N$ |
|  | Crystal thickness (mm) | 6 | 3 | 2 | 4.5 | 6 | 8 |
|  | Crystal growth rate (μm/hr) | 200 | 100 | 67 | 150 | 200 | 266 |
|  | Full-width at half-maximum of X-ray diffraction peak on (0002) face (arcsec) | 50 | 120 | 150 | 70 | 45 | 50 |
|  | Dislocation density ($cm^{-2}$) | $8.0 \times 10^4$ | $6.0 \times 10^5$ | $7.0 \times 10^5$ | $5.0 \times 10^5$ | $8.0 \times 10^4$ | $1.0 \times 10^5$ |
|  | Remarks |  |  |  |  |  |  |

As is clear from Tables I and II, in $Al_xGa_{1-x}N$ single crystal sublimation growth, the presence, as source material to be sublimated, of $Al_yGa_{1-y}N$ source, of any specific element picked out from IVb elements, and of at least a single kind of impurity element selected from the group consisting of IIa elements heightened crystal growth rate increases, and made it possible to obtain low-dislocation-density $Al_xGa_{1-x}N$ single crystal of favorable crystallinity. Furthermore, making molar ratio $n_E/n_A$ of the impurity element atoms to Al atoms in the $Al_yGa_{1-y}N$ source included in the source material to be sublimated 0.01 to 0.5 inclusive, and/or making molar ratio $n_E/n_O$ of the impurity element atoms to the atoms oxygen contained in the source material to be sublimated $1 \times 10^4$ or less, kept crystal growth rate high, and enabled obtaining lower-dislocation-density $Al_xGa_{1-x}N$ single crystal of favorable crystallinity.

Embodiment 15

As in Embodiment 5, an AlN single crystal (the $Al_xGa_{1-x}N$ single crystal 4) 2 inches (5.08 cm) in diameter×4.8 mm in thickness was grown. In this AlN single crystal (the $Al_xGa_{1-x}N$ single crystal 4), its dislocation density was a low $9.0 \times 10^4$ $cm^{-2}$, and as to impurity concentration measured by SIMS, carbon atom concentration was approximately $1 \times 10^{18}$ $cm^{-3}$, and oxygen atom concentration was $1 \times 10^{17}$ $cm^{-3}$ or less. Referring to FIG. 5, subsequently, AlN powder was sublimated to grow another AlN single crystal (the $Al_sGa_{1-s}N$ single crystal 5) onto the AlN single crystal (the $Al_xGa_{1-x}N$ single crystal 4). Apart from making the temperature in the part of the crucible 12 where $Al_tGa_{1-t}N$ source 7 was arranged 2200° C, and from making the temperature in the part end of the crucible 12 where the $Al_xGa_{1-x}N$ single crystal 4 was grown 2050° C, crystal growth conditions was established as in Embodiment 5. The obtained AlN single crystal (the $Al_sGa_{1-s}N$ single crystal 5), which was a large 2 inches (5.08 cm) in diameter×1 mm in thickness with a uniform thickness. The AlN single crystal (the $Al_sGa_{1-s}N$ single crystal 5) dislocation density was a low $2.0 \times 10^5$ $cm^{-2}$, and as to impurity concentration measured by SIMS, both carbon atom and oxygen atom concentrations were an extremely low $1 \times 10^{17}$ $cm^{-3}$. As just described, as a result of sublimating the source material 1 including the $Al_yGa_{1-y}N$ source 2 and at least a single kind of impurity element 3 selected form the group consisting of IVb elements and IIa elements to grow the $Al_xGa_{1-x}N$ single crystal 4, and of sublimating the $Al_tGa_{1-t}N$ source 7 to grow onto the $Al_xGa_{1-x}N$ single crystal 4 the $Al_sGa_{1-s}N$ single crystal 5 in which the impurity element 3 was contained at lower concentrations compared with those in the $Al_xGa_{1-x}N$ single crystal 4, the $Al_sGa_{1-s}N$ single crystal 5 low in both dislocation density and impurity concentration can be obtained.

The presently disclosed embodiments and implementation examples should in all respects be considered to be illustrative and not limiting. The scope of the present invention is set forth not by the foregoing description but by the scope of the patent claims, and is intended to include meanings equivalent to the scope of the patent claims and all modifications within the scope.

The invention claimed is:

1. A III-nitride single-crystal growth method, comprising:
a step of placing source material (1) in a crucible (12) provided with a first source material compartment (12p), a second source material compartment (12q), and a crystal-growth compartment (12r), and provided with ventilation openings (12a, 12b, 12c) between the first source material compartment (12p) and the second source material compartment (12q), and between at least one source material compartment of the first and the second source material compartments (12p, 12q) and the crystal-growth compartment (12r); and
a step of sublimating the source material (1) to grow an $Al_xGa_{1-x}N$ (0<x≦1) single crystal (4) in the crucible (12); wherein
the source material (1) includes an $Al_yGa_{1-y}N$ (0<y≦1) source (2), and an impurity element (3),
the impurity element (3) is at least one selected from the group consisting of IVb elements and IIa elements,
the crucible (12) is made of a substance that is different from the impurity element (3),
the $Al_yGa_{1-y}N$ source (2) is arranged in the first source material compartment (12p) and the impurity element (3) is arranged in the second source material compartment (12q),
in the source material (1), a ratio $n_E/n_A$ of the number of moles $n_E$ of atoms of the impurity element (3) to the number of moles $n_A$ of the Al atoms in the $Al_yGa_{1-y}N$ source (2) is between 0.01 to 0.5 inclusive, and
a ratio $n_E/n_O$ of the number of moles $n_E$ of atoms of the impurity element (3) to the number of moles $n_O$ of atoms of the oxygen contained in the material source (1) is between 2 and $1 \times 10^4$ inclusive.

2. A III-nitride single-crystal growth method as set forth in claim 1, wherein the source material (1) is a mixture of the $Al_yGa_{1-y}N$ source (2) in solid form and the impurity element (3) in solid form.

3. A III-nitride single-crystal growth method as set forth in claim 1, characterized in that the impurity element (3) is any one of Si, C, and Ge.

4. A III-nitride single-crystal growth method as set forth in claim 1, wherein the crucible (12) is formed from metal carbide.

5. A III-nitride single-crystal growth method as set forth in claim 1, further comprising a step of disposing an undersubstrate (9) in the crucible (12) to grow the $Al_xGa_{1-x}N$ single crystal (4) onto the under substrate (9).

6. A III-nitride single crystal growth method as set forth in claim 1, wherein the $Al_xGa_{1-x}N$ single crystal (4) has a diameter of 2 inches or more.

7. A III-nitride single-crystal growth method comprising a step of sublimating an $Al_tGa_{1-t}N$ ($0<t\leqq1$) source (7) to grow onto the $Al_xGa_{1-x}N$ single crystal (4) grown by the method set forth in claim 1 a $Al_sGa_{1-s}N$ ($0<s\leqq1$) single crystal (5) in which the impurity element (3) is contained at lower concentration compared with that in the $Al_xGa_{1-x}N$ single crystal (4).

8. A method of growing $Al_xGa_{1-x}N$ ($0<x\leqq1$) by sublimation, the method comprising:
 (i) a step of arranging, in a lower part of a vented crucible in a vertical sublimation-furnace reaction chamber, an $Al_yGa_{1-y}N$ ($0<y\leqq1$) source material and an impurity-atoms source material, with the impurity-atoms source material consisting of either a Group IVA element or a Group IIA element and the crucible being made of a non-impurity-atoms material, in proportions such that at least either the ratio $n_E/n_A$ of the number of moles $n_E$ of the impurity atoms to the number of moles $n_A$ of the aluminum atoms in the $Al_yGa_{1-y}N$ source is between 0.01 and 0.5 inclusive, or the ratio $n_E/n_O$ of the number of moles $n_E$ of the impurity atoms to the number of moles $n_O$ of oxygen atoms contained in the source material is between 2 and $1\times10^4$;
 (ii) a step of flowing $N_2$ gas through the sublimation furnace at an amount controlled so that the $N_2$ partial pressure in the reaction chamber outside the crucible is within a predetermined range; and
 (iii) a step of heating the crucible in such a way that the temperature of the $Al_yGa_{1-y}N$ source and impurity atoms in the lower part is 10 to 200° C higher than the temperature in an upper part of the crucible where the $Al_xGa_{1-x}N$ grows, to sublimate the source material.

9. An $Al_yGa_{1-y}N$ sublimation-growth method according to claim 8, wherein in said step (ii), the predetermined $N_2$ partial-pressure range is from 101.3 to 1013 hPa.

10. An $Al_yGa_{1-y}N$ sublimation-growth method according to claim 8, wherein:
 the $Al_yGa_{1-y}N$ source and the impurity atoms source are in a mixture in solid form; and
 the method further comprises a step of heat-treating the $Al_yGa_{1-y}N$ Source—impurity atoms mixture to activate the impurity atoms and disperse the impurity atoms through the mixture.

* * * * *